US008609182B2

(12) United States Patent
Britt et al.

(10) Patent No.: US 8,609,182 B2
(45) Date of Patent: Dec. 17, 2013

(54) SOLUTION CONTAINMENT DURING BUFFER LAYER DEPOSITION

(75) Inventors: Jeffrey S. Britt, Tucson, AZ (US); Scot Albright, Tucson, AZ (US); Urs Schoop, Tucson, AZ (US)

(73) Assignee: Global Solar Energy, Inc., Tucson, AZ (US)

( * ) Notice: Subject to any disclaimer, the term of this patent is extended or adjusted under 35 U.S.C. 154(b) by 660 days.

(21) Appl. No.: 12/397,863

(22) Filed: Mar. 4, 2009

(65) Prior Publication Data
US 2010/0086699 A1  Apr. 8, 2010

Related U.S. Application Data

(60) Provisional application No. 61/068,458, filed on Mar. 5, 2008.

(51) Int. Cl.
B05D 5/12 (2006.01)
C23C 14/54 (2006.01)

(52) U.S. Cl.
USPC .......... 427/74; 427/8; 427/9; 427/75; 427/76; 427/125; 427/126.5; 427/172; 427/271; 427/275; 427/426; 427/427; 118/44; 118/72; 438/62; 438/86; 438/484

(58) Field of Classification Search
None
See application file for complete search history.

(56) References Cited

U.S. PATENT DOCUMENTS

| 3,148,084 | A |   | 9/1964  | Hill et al. |
|-----------|---|---|---------|-------------|
| 4,043,296 | A | * | 8/1977  | Chu et al. ...................... 118/419 |
| 4,143,235 | A |   | 3/1979  | Duisman |
| 4,204,933 | A |   | 5/1980  | Barlow et al. |
| 4,366,337 | A |   | 12/1982 | Alessandrini et al. |
| 4,642,140 | A |   | 2/1987  | Noufi et al. |
| 4,778,478 | A |   | 10/1988 | Barnett |
| 5,112,410 | A |   | 5/1992  | Chen |
| 5,578,502 | A |   | 11/1996 | Albright et al. |
| 5,891,509 | A | * | 4/1999  | Kawana et al. ................. 427/10 |
| 6,268,014 | B1 |  | 7/2001  | Eberspacher et al. |
| 6,281,098 | B1 |  | 8/2001  | Wang et al. |
| 6,310,281 | B1 |  | 10/2001 | Wendt et al. |
| 6,350,489 | B1 |  | 2/2002  | Moriyama et al. |
| 6,417,027 | B1 |  | 7/2002  | Akram |
| 6,428,851 | B1 |  | 8/2002  | Friedersdorf et al. |
| 6,537,845 | B1 |  | 3/2003  | McCandless et al. |
| 7,393,516 | B2 |  | 7/2008  | Seo et al. |
| 2003/0059526 | A1 | | 3/2003 | Benson et al. |
| 2004/0067321 | A1 | | 4/2004 | Kondo et al. |
| 2005/0115502 | A1 | | 6/2005 | George et al. |

(Continued)

OTHER PUBLICATIONS

The International Bureau of WIPO, International Search Report regarding PCT Appl. No. PCTUS09/01429 dated Jun. 17, 2009, 2 pgs.

(Continued)

*Primary Examiner* — Jeffrey Wollschlager
(74) *Attorney, Agent, or Firm* — Kolisch Hartwell, P.C.

(57) ABSTRACT

Improved methods and apparatus for forming thin-film layers of chalcogenide on a substrate web. Solutions containing the reactants for the chalcogenide layer may be contained substantially to the front surface of the web, controlling the boundaries of the reaction and avoiding undesired deposition of chalcogenide upon the back side of the web.

10 Claims, 5 Drawing Sheets

(56) References Cited

U.S. PATENT DOCUMENTS

| | | | |
|---|---|---|---|
| 2005/0158909 | A1 | 7/2005 | Milliron et al. |
| 2005/0278163 | A1 | 12/2005 | Poplack et al. |
| 2006/0019333 | A1 | 1/2006 | Rodgers et al. |
| 2006/0019427 | A1 | 1/2006 | Cao |
| 2006/0062902 | A1 | 3/2006 | Sager et al. |
| 2006/0096537 | A1 | 5/2006 | Tuttle |
| 2007/0122936 | A1 | 5/2007 | Park et al. |
| 2007/0169809 | A1 * | 7/2007 | Van Duren et al. ............ 136/262 |
| 2007/0243657 | A1 | 10/2007 | Basol et al. |
| 2007/0253686 | A1 | 11/2007 | Wendt et al. |
| 2008/0153268 | A1 | 6/2008 | Johnston et al. |
| 2008/0175982 | A1 | 7/2008 | Robinson et al. |
| 2008/0213467 | A1 | 9/2008 | Yu et al. |
| 2008/0300323 | A1 | 12/2008 | Caldwell et al. |
| 2009/0077805 | A1 | 3/2009 | Bachrach et al. |
| 2009/0305449 | A1 * | 12/2009 | Bollman et al. ................ 438/57 |

OTHER PUBLICATIONS

The International Bureau of WIPO, International Search Report regarding PCT Appl. No. PCTUS09/01427 dated Jun. 25, 2009, 2 pgs.

The International Bureau of WIPO, International Search Report regarding PCT Appl. No. PCTUS09/01432 dated Jun. 19, 2009, 2 pgs.

Tsui et al., "Techniques for Combinatorial Molecular Beam Epilaxy," Rev. Scl. Intr. vol. 76, Issue 6, Article 062206, May 18, 2005, 5pgs.

The International Bureau of WIPO, International Search Report regarding PCT Appl. No. PCT/US09/01428 dated Mar. 5, 2012, 2 pages.

The International Bureau of WIPO, Written Opinion of the International Searching Authority regarding PCT Application No. PCT/US09/01428 dated Mar. 5, 2012, 11 pages.

* cited by examiner

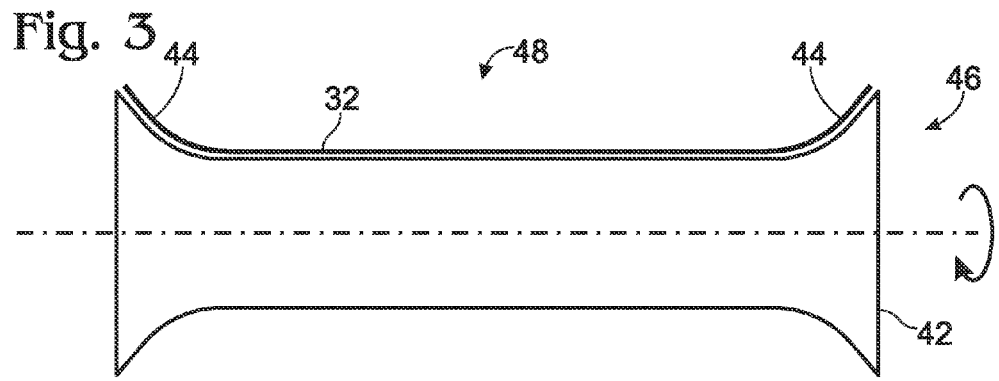
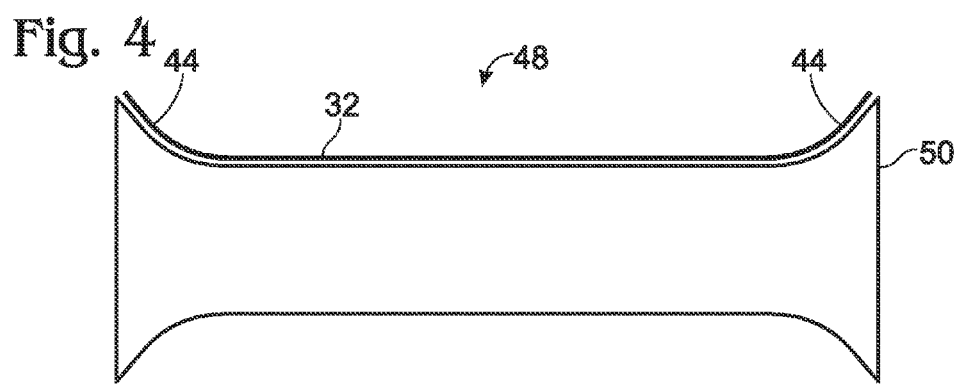
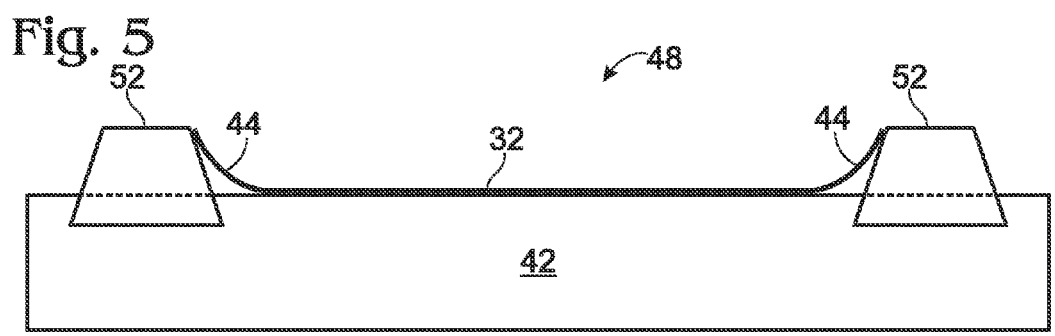
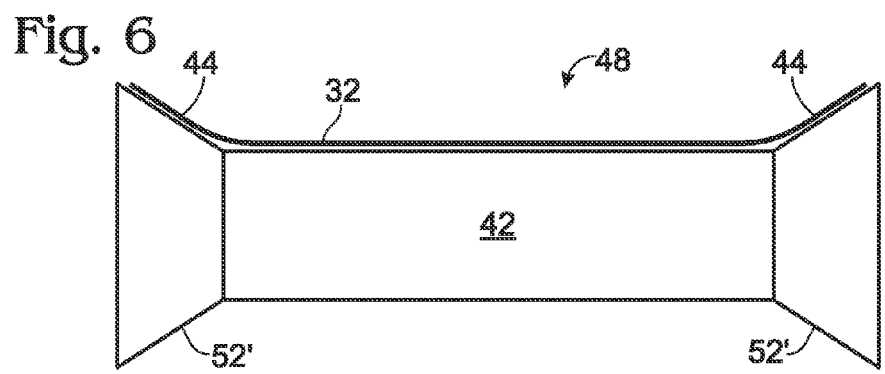

SOLUTION CONTAINMENT DURING BUFFER LAYER DEPOSITION

CROSS-REFERENCE TO RELATED APPLICATION

This application claims priority under 35 U.S.C. §119 and applicable foreign and international law of U.S. Provisional Patent Application Ser. No. 61/068,458, filed on Mar. 5, 2008, which is hereby incorporated by reference in its entirety.

BACKGROUND

The field of photovoltaics generally relates to multi-layer materials that convert sunlight directly into DC electrical power. The basic mechanism for this conversion is the photovoltaic (or photoelectric) effect, first correctly described by Einstein in a seminal 1905 scientific paper for which he was awarded a Nobel Prize for physics. In the United States, photovoltaic (PV) devices are popularly known as solar cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from junction, with the electron moving toward the n-type side, and the hole moving toward the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage. The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin film" PV cell. In comparison to other types of PV cells, such as crystalline silicon PV cells, thin film PV cells require less light-absorbing material to create a working cell, and thus can reduce processing costs. Thin film based PV cells also offer improved cost by employing previously developed deposition techniques widely used in the thin film industries for protective, decorative, and functional coatings. Common examples of low cost commercial thin film products include water permeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin film deposition techniques.

Furthermore, thin film cells, particularly those employing a sunlight absorber layer of copper indium diselenide, copper indium disulfide, copper indium aluminum diselenide, or copper indium gallium diselenide, have exhibited efficiencies approaching 20%, which rivals or exceeds the efficiencies of the most efficient crystalline cells. In particular, copper indium gallium diselenide (CIGS) is stable, has low toxicity, and is truly thin film, requiring a thickness of less than two microns in a working PV cell. As a result, to date CIGS appears to have demonstrated the greatest potential for high performance, low cost thin film PV products, and thus for penetrating bulk power generation markets.

Thin film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, such rigid substrates suffer from various shortcomings, such as a need for substantial floor space for processing equipment and material storage, specialized heavy duty handling equipment, a high potential for substrate fracture, increased shipping costs due to the weight and delicacy of the glass, and difficulties in installation. As a result, the use of glass substrates is not optimal for large-volume, high-yield, commercial manufacturing of multi-layer functional thin film materials such as photovoltaics.

In contrast, roll-to-roll processing of thin flexible substrates allows for the use of compact, less expensive vacuum systems, and of non-specialized equipment that already has been developed for other thin film industries. PV cells based on thin flexible substrate materials also exhibit a relatively high tolerance to rapid heating and cooling and to large thermal gradients (resulting in a low likelihood of fracture or failure during processing), require comparatively low shipping costs, and exhibit a greater ease of installation than cells based on rigid substrates.

A particular type of n-type semiconductor material that may be used in thin-film PV cells is known in the field of chemistry as a chalcogenide. A chalcogenide is a chemical compound consisting of at least one chalcogen ion and at least one more electropositive element such as a metal. Forming a thin film of chalcogenide is described in the prior art, for example, in U.S. Pat. No. 6,537,845 to McCandless et al., which is hereby incorporated into the present disclosure by reference for all purposes. However, forming chalcogenide films having a desired thickness and uniformity remains technically challenging and improvements are needed.

Historically, the formation of a thin-film chalcogenide buffer layer or layers often proceeds by a relatively inefficient cyclical process that includes heating the substrates in a water-containing vessel to an elevated temperature, adding and mixing in a metallic salt, and then adding and mixing in a chalcogen-containing component. After a proscribed time at a proscribed temperature, the reaction is complete, the substrates are removed, the used solution is sent to waste treatment, reactant-containing solution is applied to the web, and the vessel is cleaned for the next reaction. In addition, existing methods of applying the reactant-containing solution to the web typically result in deposition of chalcogenide over both the desired ("front" or "top") surface of the web, and also over at least a portion of the other ("back" or "bottom") surface of the web, requiring at least one cleaning step to remove the material from the back surface. This is typically accomplished with an acidic solution that must be carefully controlled and completely removed to avoid damage to the desired thin-film layers and to avoid long-term corrosion issues activated by the presence of residual acidity.

Furthermore, when reactant solutions reach the back side of the substrate, either because the entire substrate is immersed in a bath of reactant solution, or because solutions applied to the top side of the substrate are insufficiently contained on the top side, it may be difficult or impossible to remove all of the excess chalcogenide that forms on the back of the substrate and/or any heating elements. This can affect the amount of heat reaching the top of the substrate. For example, chalcogenide build-up on the underside of the substrate may affect the heat capacity of the substrate and its thermal conductivity, and chalcogenide build-up on the heaters may affect the emissivity and/or thermal conductivity of the heaters. Furthermore, these effects may be non-uniform across the width of the substrate.

Such undesirable chalcogenide deposition on the underside of the substrate and/or on any heating elements disposed on that side of the substrate may result in a poorly controlled substrate temperature and the corresponding formation of a chalcogenide buffer layer having undesirable characteristics. For example, if the amount of heat reaching the top surface of the substrate is decreased due to chalcogenide formation under the substrate, this may result in the formation of an undesirably thin chalcogenide buffer layer on the top surface. Similarly, if the amount of heat reaching the top surface of the substrate is non-uniform due to non-uniform chalcogenide formation under the substrate, this may result in the formation of an undesirably non-uniform chalcogenide buffer layer on the top surface. These effects may be difficult to control due to unpredictable and uncontrolled chalcogenide formation under the substrate.

It is known in the art to deposit a chalcogenide layer on a substrate web in a roll-to-roll process and to raise the lateral edges of the substrate web, for example by draping the web edges over vertical rails, to improve solution containment. However, this typically leads to undesirable buckling forces on the web, making it difficult to maintain a desired degree of flatness in the deposition region. At the same time, previous systems used a hold-down mechanism such as one or more wheels to keep the web in contact with an underlying surface such as a conductive heater. However, this creates local hot spots on the substrate, resulting in undesirable nonuniformities in the chalcogenide layer. It is also known in the art to tilt the entire web longitudinally to control the depth of reactant solutions on the web. However, these prior systems do not provide for multiple slope adjustments in various portions of the deposition region, and thus may not provide sufficient control over the solution depth and the corresponding chalcogenide thickness. For all of the above reasons, improved methods and apparatus for containing chalcogenide reactants to the front or top surface of a substrate are desirable.

SUMMARY

The present teachings disclose improved methods and apparatus for forming thin film layers of chalcogenide on a substrate web. According to the present teachings, solutions containing the reactants for the chalcogenide layer may be contained substantially to the front surface of the web, avoiding undesired deposition of chalcogenide upon the back side.

BRIEF DESCRIPTION OF THE DRAWINGS

FIG. 3 is a partial sectional view of a transport roller with a concave transverse profile lifting transverse edge portions of a substrate web while supporting and transporting the web.

FIG. 4 is a partial sectional view of a transverse lifting structure with a concave transverse profile lifting transverse edge portions of a substrate web while supporting the web.

FIG. 5 is a partial sectional view of frustoconical bearing surfaces lifting transverse edge portions of a substrate web.

FIG. 6 is a partial section view of angled lifting structures disposed at the transverse edges of a transport roller and supporting the transverse edge portions of a substrate web.

DETAILED DESCRIPTION

I. Introduction

Manufacture of flexible thin-film PV cells may proceed by a roll-to-roll process. As compared to rigid substrates, roll-to-roll processing of thin flexible substrates allows for the use of relatively compact, less expensive vacuum systems, and of some non-specialized equipment that already has been developed for other thin-film industries. Flexible substrate materials inherently have lower heat capacity than glass, so that the amount of energy required to elevate the temperature is minimized. They also exhibit a relatively high tolerance to rapid heating and cooling and to large thermal gradients, resulting in a low likelihood of fracture or failure during processing. Additionally, once active PV materials are deposited onto flexible substrate materials, the resulting unlaminated cells or strings of cells may be shipped to another facility for lamination and/or assembly into flexible or rigid solar modules. This strategic option both reduces the cost of shipping (lightweight flexible substrates vs. glass), and enables the creation of partner-businesses for finishing and marketing PV modules throughout the world.

One or more of the layers deposited in a thin-film PV cell typically is a "window layer(s)" that allows usable light to penetrate to the interior of the cell, and which in some cases also may serve as the n-type semiconductor material in the cell. Such a layer also may be referred to in the PV cell field as a "buffer layer." When used both as a window layer and a semiconductor, the buffer layer ideally should be both substantially transparent to light in a desired wavelength range, and also exhibit the appropriate electronic properties. The buffer layer also could consist of multiple window layers acting also as semiconductors, such as a layer of cadmium sulfide followed by a layer of cadmium-zinc sulfide. A thin-film buffer layer with desired properties may be formed through chemical reaction between one or more metals such as zinc, cadmium, lead, mercury, or any metal or combination of metals selected from groups 1b, 2b, or 3a of the Periodic Table of the Elements, and a chalcogen such as oxygen, sulfur, selenium, or tellurium. The resulting compounds are often termed chalcogenides. Suitable window or buffer layer compounds for solar devices may include, for example, cadmium sulfide, zinc sulfide, zinc selenide, cadmium zinc selenide, zinc oxide, and cadmium zinc oxide.

Figure 1:
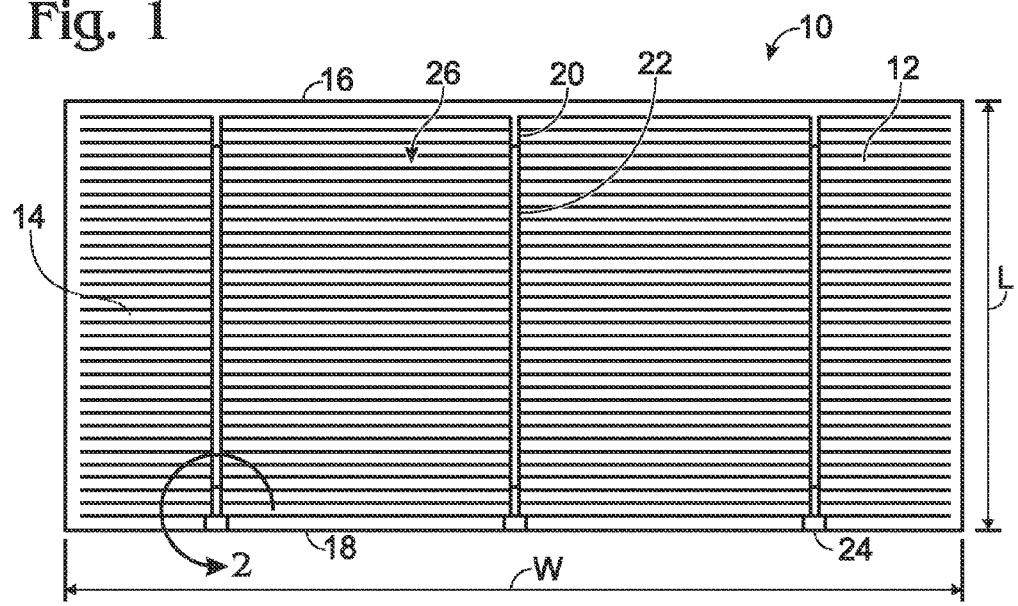
FIG. 1 is a top view of a thin film photovoltaic cell, according to aspects of the present disclosure.

FIG. 1 shows a top view of a thin-film photovoltaic cell 10, in accordance with aspects of the present disclosure. Cell 10 is substantially planar, and typically rectangular as depicted in FIG. 1, although shapes other than rectangular may be more suitable for specific applications, such as for an odd-shaped rooftop or other surface. The cell has a top surface 12, a bottom surface 14 opposite the top surface, and dimensions including a length L, a width W, and a thickness. The length and width may be chosen for convenient application of the cells and/or for convenience during processing, and typically are in the range of a few centimeters (cm) to tens of cm. For example, the length may be approximately 100 millimeters (mm), and the width may be approximately 210 mm, although any other suitable dimensions may be chosen. The edges spanning the width of the cell may be characterized respectively as a leading edge 16 and a trailing edge 18. The total thickness of cell 10 depends on the particular layers chosen for the cell, and is typically dominated by the thickness of the underlying substrate of the cell. For example, a stainless steel substrate may have thickness on the order of 0.025 mm (25 microns), whereas all of the other layers of the cell may have a combined thickness on the order of 0.002 mm (2 microns) or less.

Cell 10 is created by starting with a flexible substrate, and then sequentially depositing multiple thin layers of different materials onto the substrate. This assembly may be accomplished through a roll-to-roll process whereby the substrate travels from a pay-out roll to a take-up roll, traveling through a series of deposition regions between the two rolls. The PV material then may be cut to cells of any desired size. The substrate material in a roll-to-roll process is generally thin, flexible, and can tolerate a relatively high-temperature environment. Suitable materials include, for example, a high temperature polymer such as polyimide, or a thin metal such as stainless steel or titanium, among others. Sequential layers typically are deposited onto the substrate in individual processing chambers by various processes such as sputtering, evaporation, vacuum deposition, chemical deposition, and/or printing. These layers may include a molybdenum (Mo) or chromium/molybdenum (Cr/Mo) back contact layer; an absorber layer of material such as copper indium diselenide, copper indium disulfide, copper indium aluminum diselenide, or copper indium gallium diselenide (CIGS); a buffer layer or layers such as a layer of cadmium sulfide (CdS); and a transparent conducting oxide (TCO) layer acting as the top electrode of the PV cell. In addition, a conductive current collection grid, usually constructed primarily from silver (Ag) or some other conductive metal, is typically applied over the TCO layer.

Although the precise thickness of each layer of a thin-film PV cell depends on the exact choice of materials and on the particular application process chosen for forming each layer, exemplary materials, thicknesses and methods of application of each layer described above are as follows, proceeding in typical order of application of each layer onto the substrate:

| Layer Description | Exemplary Material | Exemplary Thickness | Exemplary Method of Application |
|---|---|---|---|
| Substrate | Stainless steel | 25 μm | N/A (stock material) |
| Back contact | Mo | 320 nm | Sputtering |
| Absorber | CIGS | 1700 nm | Evaporation |
| Buffer | CdS | 80 nm | Chemical deposition |
| Front electrode | TCO | 250 nm | Sputtering |
| Collection grid | Ag | 40 μm | Printing |

The remainder of this disclosure focuses on various methods and apparatus for forming chalcogenide buffer layer(s).

II. Solution Containment and Web Transport

This section describes methods and apparatus for transporting a web of substrate material through a deposition region, and for containing various reactant solutions that include chemical components of a buffer and/or window layer within a desired region of the web.

Figure 2:
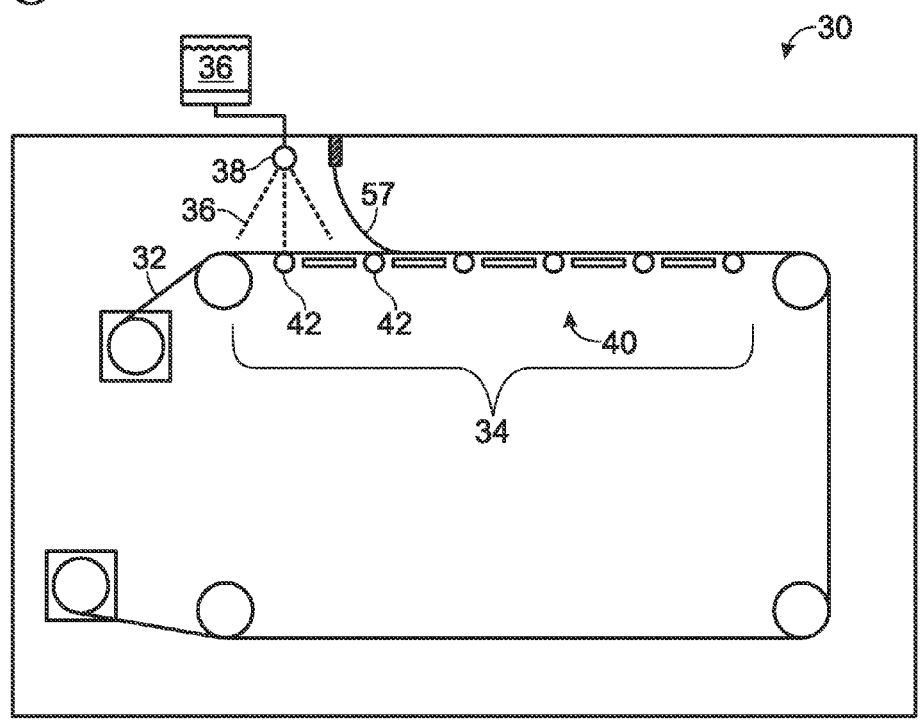
FIG. 2 is a schematic side view of an apparatus for forming a thin-film layer on a substrate web.

According to aspects of the present disclosure, a buffer layer may be applied to the underlying PV cell layers (typically a bottom substrate layer, one or more back contact layers, and an absorber layer) via a chemical deposition process. As shown in FIG. 2, the process involves an apparatus, generally indicated at 30, for transporting a web 32 of thin-film substrate material through a deposition region 34 in a longitudinal direction, and dispensing one or more reactant solutions 36 onto the web within the deposition region. To react and form a suitable chalcogenide, the reactant solution should contain, at a minimum, at least one metal and at least one chalcogen. In addition, the solution typically will contain a chemical complexant such as ammonia, and deionized water (DI).

Although the system depicted in FIG. 2 transports the web linearly and in a direction corresponding to the longitudinal dimension of the web, the present teachings also contemplate alternative methods of depositing a thin film buffer layer. These alternatives include, for example, solution application onto a concave or convex web disposed on the inside or outside of a drum-like structure, and horizontal web transport using one or a plurality of weirs (such as containers, plates, or rollers) held to a "controlled-drainage" distance from the web to hold the chalcogenide solution against the web for a suitable reaction period.

Apparatus 30 includes a transport mechanism, generally indicated at 40, for conveying a continuous flexible web of substrate material through the deposition region in the longitudinal region. Transport mechanism 40 may take various forms, such as one or more continuous belts that may convey the web while supporting it either from above or below, or a series of rollers upon which the web rests and is conveyed. FIG. 2 depicts a transport mechanism that includes a plurality of synchronized transport rollers 42 that both support the substrate web and transport it. Rollers 42 may be evenly spaced, as shown in FIG. 2, or they may be unevenly spaced to accommodate other desired elements of the apparatus. To ensure that the web is transported through the deposition region at a uniform speed along its length, rollers 42 may be synchronized by any suitable method. For example, the rollers all may be driven by a single rotating shaft, with each roller linked to the common shaft. The rollers may be linked to the shaft by a standard gear/screw linking mechanism (not shown) or by any other linking mechanism. In some cases, the support rollers may not rotate at all, but rather may be stationary, precision leveled cross pieces. In other cases, the support rollers may be rotatable but not driven, in which case the pay-out and/or take-up mechanisms may drive the motions of the substrate web.

In many existing systems for chemically synthesizing a chalcogenide buffer layer via a chemical bath, dispensing the solutions onto the web typically results in desirable deposition of the buffer layer over both the top (or front) side of the web, as well as undesirable deposition over some or all of the bottom (or back) of the web. This undesirable deposition may require a subsequent cleaning step with an acidic solution, as well as a possible second additional cleaning step to remove the residual acid used to clean the excess buffer layer in the first cleaning step. During these additional cleaning steps, it may be necessary, and can be difficult, to protect the top-side buffer layer and the other, previously deposited thin film layers on the top side of the web from attack by the active solutions used in the cleaning. The use of sacrificial or reusable protective backing material or webs has been considered, but has its own limitations and added costs.

According to the present teachings, and as depicted in FIG. 3, opposing transverse edge portions 44 of the substrate 32 may be lifted sufficiently by a lifting mechanism, generally indicated at 46. Lifting mechanism 46 is configured to lift edge portions 44 of the web, relative to a central portion 48 of the web, by an amount sufficient to contain the buffer reactant solutions substantially upon the top surface of the web. This may be accomplished in various ways. For example, as shown in FIG. 3, the lifting mechanism may include one or more transport rollers 42 having concave edge portions, so that lifting the transverse edge portions of the web is accomplished simply by passing the web over the concave transverse profile of the concave roller(s). In such embodiments, the transport rollers may serve the dual purposes of both transporting the web at a uniform speed, and containing the buffer reactant solutions upon the top surface of the web within the deposition region or any other desired longitudinal region.

Alternatively, opposing transverse edge portions of the web may be lifted by a lifting mechanism that includes dedicated lifting structures, the primary purpose of which is to support the web edges and contain the buffer reactant solutions, rather than to transport the web. For example, as depicted in FIG. 4, the dedicated lifting structures may include transverse lifting structures 50 that extend substantially across the transverse dimension of the web in a fashion similar to transport rollers 42, but that do not function as transport rollers. Transverse lifting structures 50 have a concave transverse profile, to shape the transverse profile of the web sufficiently to contain any deposited solutions, but do not rotate. Lifting structures 50 may be disposed longitudinally, for example, between two of transport rollers 42, or may replace one or more of the rollers depicted in FIG. 2.

Figure 8:
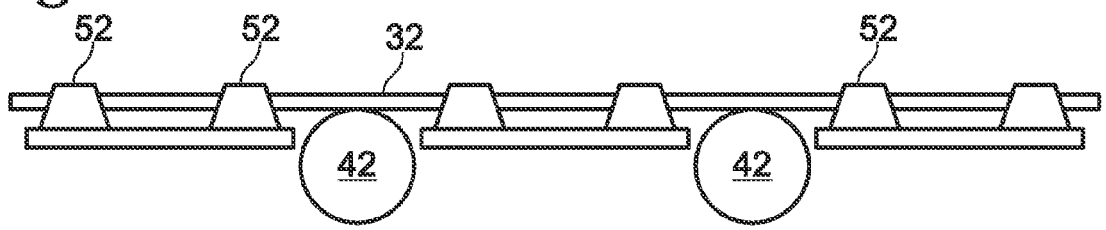
FIG. 8 is a partial side elevational view of transverse edge portions of a substrate web being lifted by frustoconical bearing surfaces, while the web is transported by transport rollers.

Many other lifting mechanisms are within the scope of the present teachings. For example, as shown in FIG. 5, lifting the web edges may be accomplished by contacting opposing transverse edge portions of the web with one or more bearing surfaces 52, which may or may not be rotatable. To lift the edge portions, the bearing surfaces typically will be disposed slightly within the transverse boundaries of the web. Bearing surfaces 52 may be approximately frustoconical as depicted in FIG. 5, or alternatively, the bearing surfaces may be spherical, cylindrical, or any other shape suitable for sufficiently lifting and supporting the edge portions of the web. For example, complex-shaped bearing surfaces may be used that have more than one slope, and/or that have a concave geometry. In some embodiments, shapes having both an inward and an outward camber may be advantageous. Furthermore, a relatively shallow slope, or multiple/continuous slopes may be less sensitive to web edge variations, while still maintaining containment of the reacting solution. Regardless of their construction, the bearing surfaces may be disposed anywhere along the longitudinal dimension of the web, and typically will be disposed either within, or in proximity to, the deposition region. For example, as depicted in FIG. 8, two opposing pairs of bearing surfaces may be disposed between adjacent transport rollers.

Figure 7:
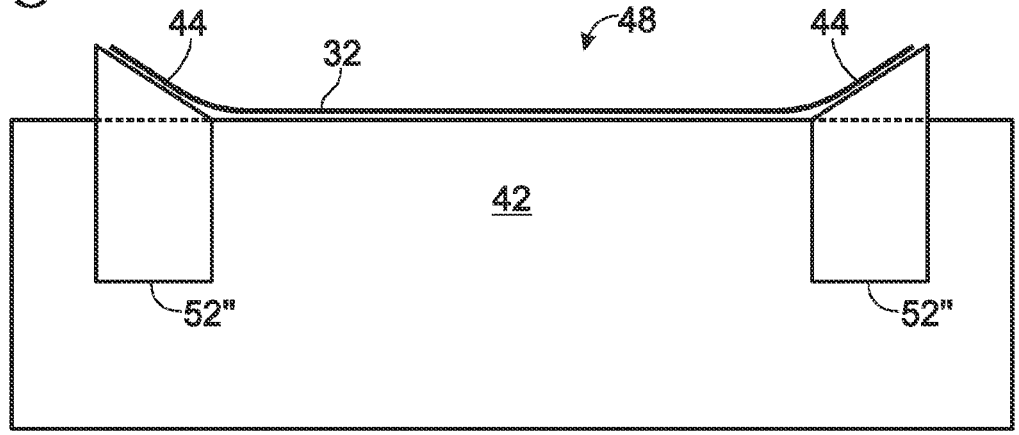
FIG. 7 is a partial sectional view of angled lifting structures disposed in front of a transport roller and supporting the transverse edge portions of a substrate web.

As depicted in FIG. 6, the lifting mechanism may include angled edge portions or bearing surfaces 52' attached to one of transport rollers 42. Although similar in many respects to the lifting mechanism depicted in FIG. 3, the mechanism depicted in FIG. 6 may have a simpler construction because angled edge portions 52' can be manufactured separately from cylindrical transport rollers 42. FIG. 7 depicts yet another alternative, where dedicated lifting structures 52" include angled edge portions configured to lift the transverse edge portions of the substrate web. As in the case of bearing surfaces 52 depicted in FIG. 5, lifting structures 52" are not attached directly to transport rollers 42, but rather may be disposed, for example, between adjacent rollers and supported by a separate support structure as shown in FIG. 8.

It should be appreciated that all of the lifting mechanisms depicted in FIGS. 3-8 include lifting structures shaped to conform to the lifted edge portions of the substrate web. For example, the lifting structures depicted in FIGS. 3-4 include concave lifting portions at their transverse edges, and the lifting structures depicted in FIGS. 5-7 include substantially planar lifting portions angled away from the central portion of the substrate web. In contrast, some prior art lifting mechanisms used vertical rails or bars, which are not shaped to conform to the lifted edge portions, to lift the substrate edges. Matching the shape of the lifting structures to the shape of the lifted edge portions may, for example, provide a small amount of friction that decreases the tendency of the central portion of the web to buckle or otherwise deviate from substantial flatness, which leads to less solution overflow, a more uniform solution layer on the substrate, and a correspondingly more uniform chalcogenide layer.

Lifting the transverse edge portions of the web may be performed in a fixed amount, or the lift may be adjustable within a range of lift amounts. In embodiments using dedicated lifting structures disposed near the transverse boundaries of the web, such as structures 52 and 52" depicted in FIGS. 5 and 7, respectively, any desired lift adjustment may be accomplished simply by adjusting the height of the lifting structures. In embodiments using either dedicated lifting structures or transport rollers that extend across the transverse dimension of the web and that have a concave transverse profile, the lift adjustment may be accomplished by altering the transverse profile of the lifting structure or roller. For example, if the concave dedicated lifting structures or concave transport rollers are segmented in the transverse dimension, the height of various segments may be adjusted individually or in groups, until a desired transverse profile is attained to provide a desired amount of lift of the edge portions of the web relative to a central portion of the web.

Figure 9:
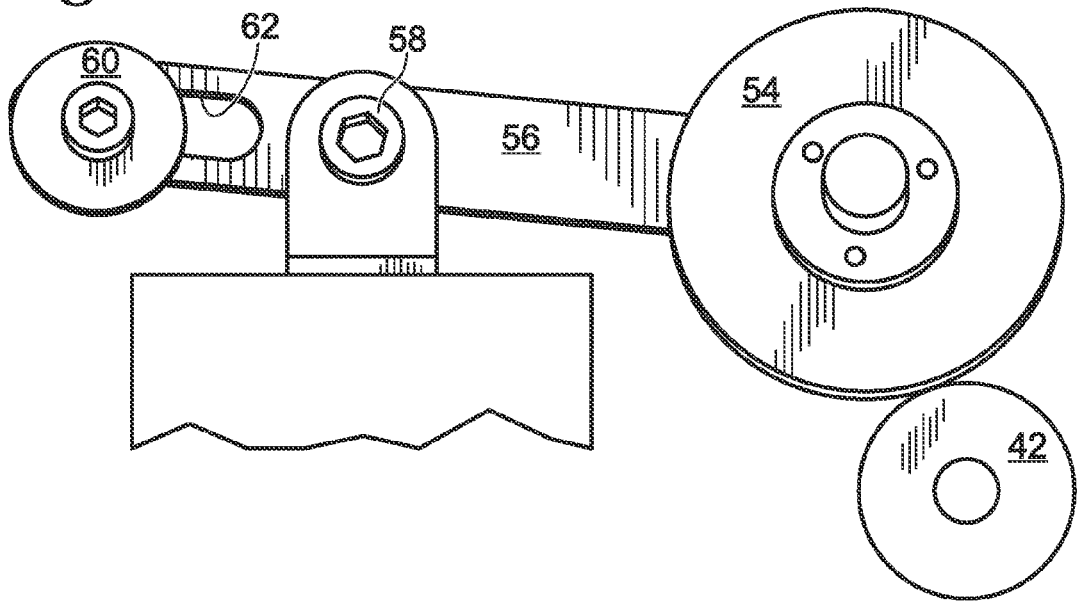
FIG. 9 is a side view showing details of a hold-down structure configured to hold a substrate web in contact with an underlying transport mechanism.
Figure 10:
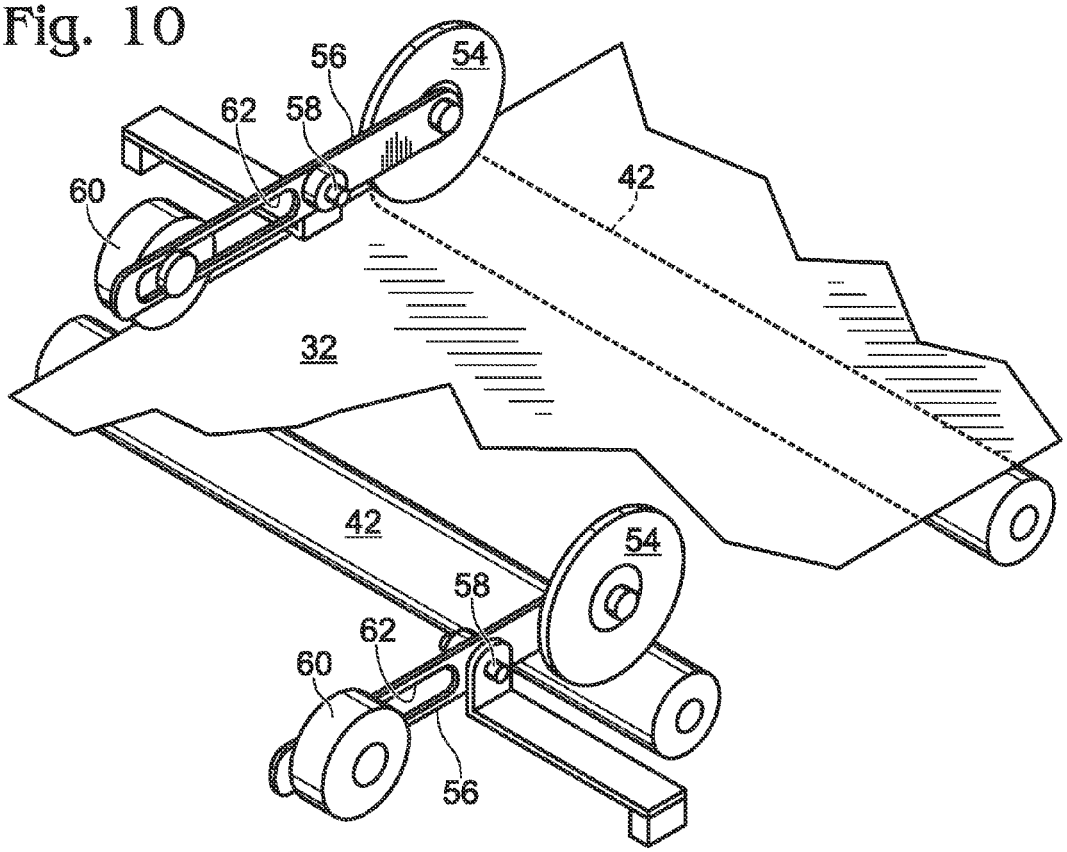
FIG. 10 is a perspective view showing a pair of hold-down structures holding a substrate web in contact with an underlying transport mechanism.

To maintain a relatively flat profile across the central portion of the web, which may be desirable to achieve substantial uniformity of a deposited buffer layer, the web may be held down and/or under tension at one or more positions. One convenient way to accomplish this is to hold the web in contact with at least a subset of the transport rollers or other transport mechanism. For instance, as depicted in FIGS. 9-10, the web may be passed underneath a plurality of hold-down rollers or wheels 54 (or any other structures configured to hold the web in contact with the transport mechanism), where each hold-down wheel is configured to hold the web in contact with a portion of an associated one of the transport rollers 42. The hold-down structures, such as wheels or rollers, may be disposed near each edge portion of each transport roller or, as FIG. 10 shows, the hold-down structures may be disposed in an alternating arrangement, with one hold-down wheel disposed near a single edge portion of each transport roller. In general, any arrangement of the hold-down structures may be suitable, provided that the structures are sufficient to hold the web under sufficient tension so that its central portion maintains a desired transverse profile.

Aside from exerting downward forces to hold the web in contact with the transport rollers, the hold-down structures may have various other useful features. For instance, as depicted in FIG. 9, the hold-down structures may be counter-weighted wheels 54 mounted on shafts 56 having intermediate pivots 58. A counterweight 60 of each structure may be adjustable within a recess 62, such that moving the counterweight in the proximal direction (toward wheel 54) increases the force of the wheel against the web, whereas moving the counterweight in the distal direction (away from wheel 54) decreases the force of the wheel against the web. This mechanism thus supplies an adjustable downward force to the web, to offset the upward force of the lifting mechanism on the web. Alternatively, the hold-down wheels may provide a controllable or predetermined pressure either pneumatically or by any other suitable mechanism. Furthermore, other structures may be used to provide a controlled hold-down pressure to the web, such as a pressurized Teflon tube/gasket mounted on a fixed structure, pairs of low-friction strips or brackets disposed above and below the web, or magnets disposed below the web.

In addition, as depicted in FIGS. 9-10, the wheels or rollers of the hold-down structures may be angled slightly outwardly from top to bottom, to supply a force to the web that has both a downward and an outward component relative to the central portion of the web. The outward component of force, when exerted at opposing edge portions of the web, supplies lateral tension to the web and thus helps to hold the central portion of the web flat, which in turn facilitates a relatively even distribution of the buffer layer reactants (and thus, of the buffer layer itself) across the transverse dimension of the web. Furthermore, the hold-down wheels may be angled slightly inwardly or outwardly relative to the longitudinal dimension of the web, either of which also may provide helpful outward forces to the web. Both of the aforementioned angles may be adjustable to some extent, to allow for variation of the side-to-side tension in the web and/or the transverse profile of the web.

Figure 11:
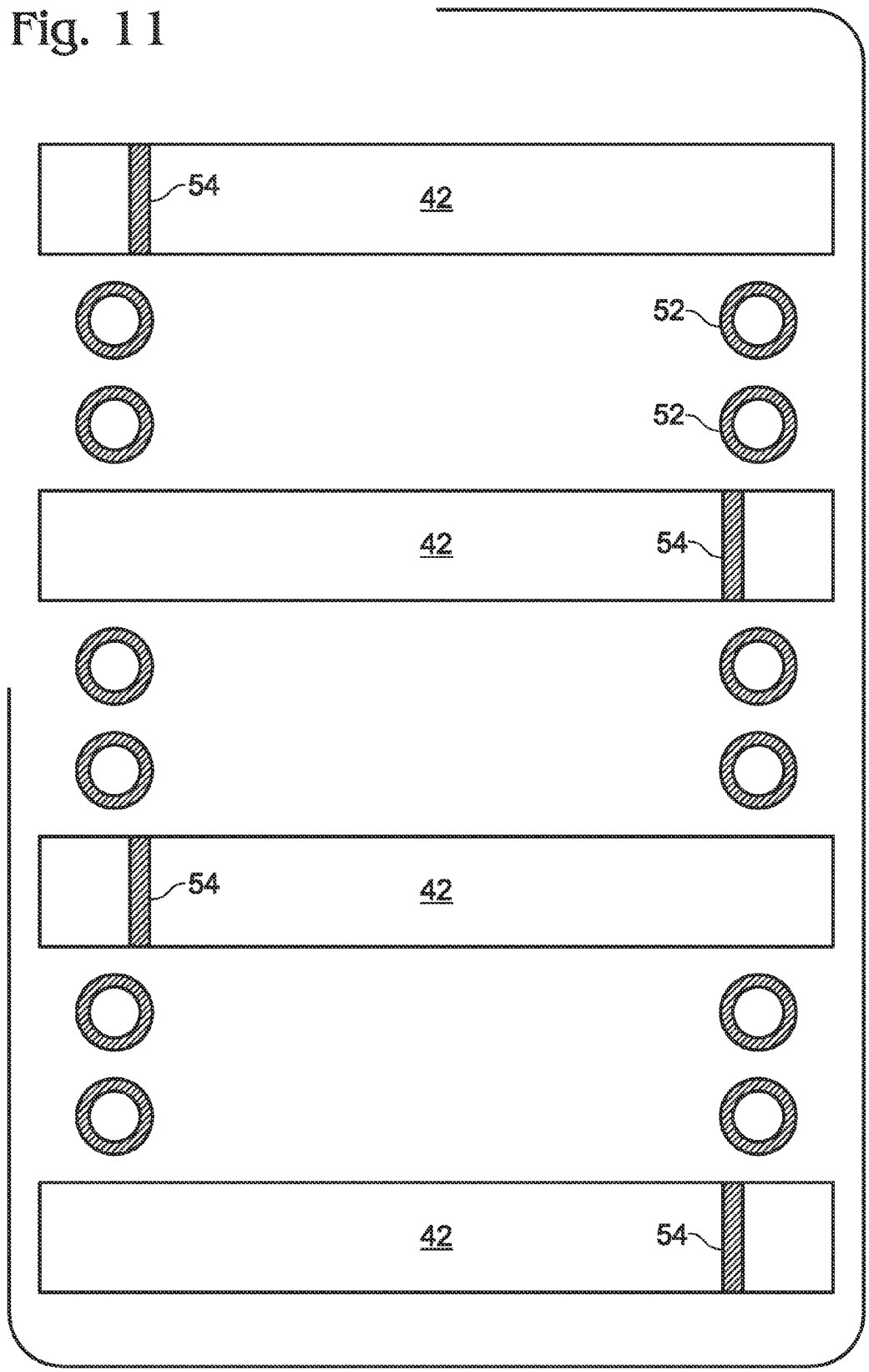
FIG. 11 is a schematic plan view of portions of an apparatus for transporting a substrate web through a deposition region, showing the relative arrangement of transport rollers, lifting structures, and hold-down mechanisms.

FIG. 11 is a schematic plan view of portions of an apparatus for transporting a substrate web (not shown) through a deposition region, showing the relative arrangement of transport rollers 42, lifting structures 52, and hold-down mechanisms 54. Although FIG. 11 depicts lifting structures 52 in the form of vertical-axis, frustoconical bearing surfaces, it should be understood that these may be replaced with lifting structures of various other shapes, such as those depicted in FIG. 4, 6 or 7. The lifting structures each may, for example, include a concave lifting portion, a substantially planar lifting portion angled away from the central portion of the web, or some other structure shaped to conform to the lifted edge portions of the web. To provide a desired amount of lift, each lifting structure may have a vertical position that is adjustable within a range of lift amounts. As FIG. 11 depicts, the lifting structures may be disposed between adjacent transport rollers 42, and may be provided as pairs of structures at each transverse edge portion of the apparatus. Alternatively, as depicted for example in FIGS. 3 and 6, the lifting structures may be formed integrally with or connected directly to the transport rollers, or as depicted for example in FIG. 4, the lifting structures may be dedicated structures that extend substantially across the transverse dimension of the substrate web without functioning as transport rollers.

Lifting one or more edge portions of the web may be performed in response to a measured property of the thin film buffer layer formed by the reactant solutions. For example, the amount of lift on one or both sides of the web may be adjusted in response to a measurement of the uniformity of the thin film buffer layer. If the buffer layer is measured to be asymmetrically disposed across the transverse dimension of the web, then the amount of lift on just one side may be adjusted until substantial symmetry of the buffer layer is restored. If the buffer layer is measured to be sufficiently symmetric, but is undesirably thick toward the center of the transverse dimension of the web, undesirably thin toward the edges of the transverse dimension of the web, or vice versa, then the amount of lift on both sides may be adjusted until greater transverse uniformity of the buffer layer thickness is attained. Similarly, the amount of lift on one or both sides of the web may increased as necessary to contain the reactant solutions, if a measurement (or mere visual inspection) indicates that one or more of the solutions is not being sufficiently contained to the top surface of the web.

Figure 12:
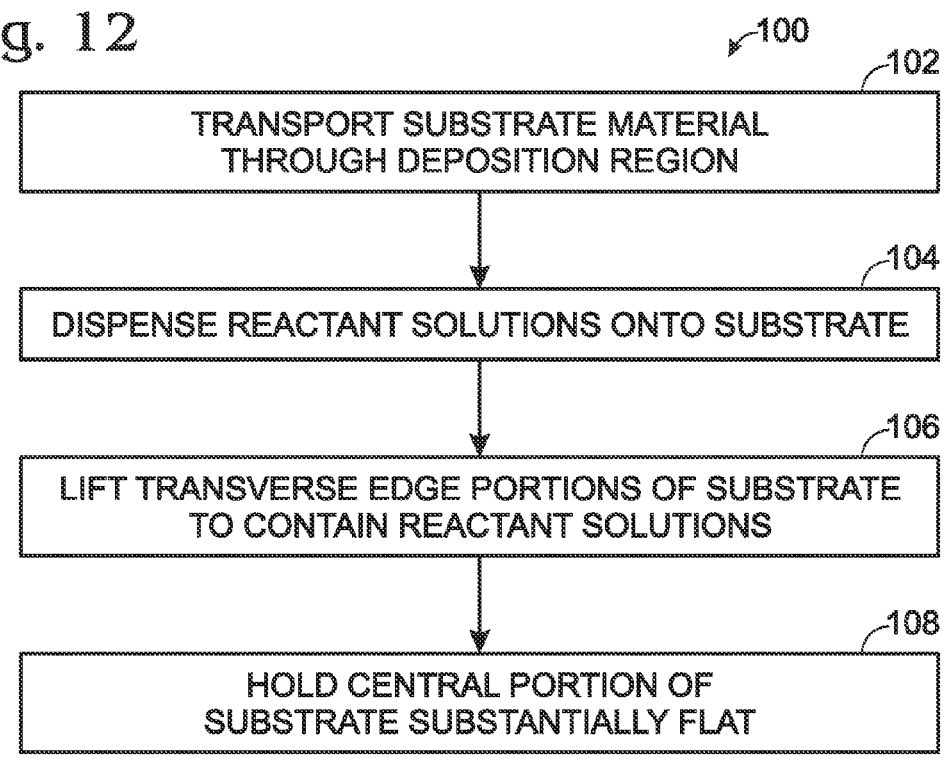
FIG. 12 is a flow chart depicting a method of forming a thin film chalcogenide buffer layer on a substrate web.

FIG. 12 is a flow chart depicting a method, generally indicated at 100, of depositing a thin film chalcogenide buffer layer onto a flexible substrate. At step 102, a web of thin-film substrate material is transported through a deposition region in a longitudinal direction. As described previously, the substrate material may include a base substrate, such as a thin sheet of stainless steel, upon which one or more thin-film layers have already been deposited. For example, a back contact layer constructed from an electrically conductive material such as molybdenum, and a p-type semiconductor photon absorber layer constructed from a material such as CIGS, may already have been deposited on the base substrate. It should be understood that the substrate web may include these layers when it is transported through the deposition region. The web will generally be transported in a roll-to-roll or other similar process, in which case the longitudinal direction will be the direction of travel between the pay-out roll and the take-up roll.

At step 104, a metal-containing solution and a chalcogen-containing solution are dispensed onto the top surface of the substrate web. The metal-containing solution contains a metal known to react with a chalcogen to form chalcogenide, and thus will generally be selected from the group consisting of copper, silver, gold, zinc, cadmium, mercury, lead, boron, aluminum, gallium, indium, and thallium. The chalcogen-containing solution contains a chalcogen selected from the group consisting of oxygen, sulfur, selenium and tellurium, and which is known to react with the metal in the metal-containing solution to form a chalcogenide with desired optical and/or electronic properties. One exemplary combination is for cadmium to combine with sulfur to produce cadmium sulfide, but other chalcogenides may be suitable as buffer layers and/or n-type semiconductor layers. Prior to or as part of step 104, the substrate web may be rinsed with deionized water or some other suitable solution. This rinsing may remove surface irregularities or other artifacts left over from a prior deposition process (such as CIGS deposition), and thus provide a relatively more consistent surface for chalcogenide deposition.

It should be appreciated that the metal-containing solution and the chalcogen-containing solution may be dispensed at any desired position(s) within the deposition region. For example, the solutions may be dispensed together by a single dispenser 38, as depicted in FIG. 2, or the solutions may be dispensed by separate dispensers. These dispensers may be separated by a sufficient distance in the longitudinal direction, such as one inch or more, to allow appreciable surface ion exchange between the metal in the metal-containing solution and an underlying layer of photovoltaic material, in a region between the first position and the second position. This may have beneficial effects upon the electronic properties of the underlying semiconductor layer (such as a CIGS layer) of the PV cell. Alternatively, separate dispensers may dispense the reactant solutions at positions that may be substantially coincidental, i.e. the metal-containing solution and the chalcogen-containing solution may be dispensed separately but at substantially the same longitudinal position on the substrate web.

Furthermore, the metal-containing solution and/or the chalcogen-containing solution may be heated to a temperature sufficient to provide at least a substantial portion of the heat of reaction for chalcogenide formation on the web. Accordingly, the temperature of one or both of the reactant solutions will generally be greater than the temperature of the moving web (prior to application of the solution). For example, the metal-containing solution may be heated to a temperature in the range of 55-70 degrees Celsius, whereas prior to application of the reactant solutions, the web may have a temperature in the range of 25-45 degrees Celsius.

At step 106, the transverse edge portions of the substrate web are lifted relative to a central portion of the web, to contain at least some of the metal-containing and chalcogen-containing solutions substantially upon the top surface of the web. As has been described previously, this may be accomplished through the use of a lifting mechanism such as a plurality of lifting structures disposed near the transverse edge portions of the substrate. These structures may take any suitable form, such as those depicted in FIGS. 3-8. It may be advantageous to configure the lifting structures to conform to the shape of the lifted edge portions of the substrate, because this may prevent localized forces near the edges of the substrate that could result in buckling or other vertical nonuniformities within the central portion of the web.

At step 108, the central portion of the web is held substantially flat. This may be accomplished by holding selected portions of the web in contact with the underlying transport mechanism, such as underlying transport rollers. For example, as depicted in FIG. 10 and described above, holding the web in contact with the transport mechanism may include passing the web underneath a plurality of hold-down wheels 54, where each wheel is configured to hold the web in contact with one of transport rollers 42. As FIG. 10 depicts, the hold-down wheels may be disposed above the transport rollers in an alternating arrangement, and may be configured to supply an adjustable force having downward and/or outward components to the substrate web. A downward component of force serves to hold the web down near its edges, whereas an outward component of force serves to hold the central portion of the web under tension, which may result in a greater degree, or an adjustable degree, of flatness in the central portion. Thus, to adjust the degree of solution containment while maintaining substantial flatness of the central portion of the substrate web, the amount of vertical lift of the edges of the web, the downward hold-down force near the lifted edges, and the lateral web tension all may be adjusted.

Alternatively, holding the central portion of the web flat may be accomplished by passing the web between one or more pairs of longitudinal strips made from a low-friction material such as Teflon, where the strips are configured to exert a desired hold-down force or pressure to a region of the substrate. As another alternative, magnets may be used to exert a downward force on one or more regions of the substrate. Such magnets may, for example, be disposed in longitudinal strips under the substrate, either in contact or at a known distance from the bottom of the web.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following numbered claims particularly point out certain combinations and subcombinations regarded as novel and nonobvious. Inventions embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original numbered claims that follow, also are regarded as included within the subject matter of the inventions of the present disclosure.

We claim:

1. A method of depositing a thin film chalcogenide buffer layer onto a flexible substrate, comprising:
    transporting a web of thin film substrate material through a deposition region by passing the web over a plurality of transport rollers disposed within the deposition region;
    dispensing onto a top surface of the web a metal-containing solution containing a metal chosen from the group consisting of copper, silver, gold, zinc, cadmium, mercury, lead, boron, aluminum, gallium, indium and thallium, and a chalcogen-containing solution containing a chalcogen chosen from the group consisting of oxygen, sulfur, selenium and tellurium;
    lifting transverse edge portions of the web relative to a central portion of the web to contain at least a portion of the metal-containing solution and at least a portion of the chalcogen-containing solution substantially upon the top surface of the web; and
    holding the central portion of the web substantially flat; and
    wherein holding the central portion of the web substantially flat includes holding the web in contact with the transport rollers at discrete positions within the deposition region by passing the web underneath a plurality of wheels, each wheel disposed directly above one of the transport rollers and between the central portion and one of the lifted transverse edge portions of the web, and configured to hold the web in contact with that roller.

2. The method of claim 1, wherein the transport rollers are configured to transport the web out of physical contact with a web heating mechanism.

3. The method of claim 1, wherein at least one of the transport rollers has concave edge portions, and wherein lifting the transverse edge portions of the web includes passing the web over the concave edge portions of the at least one roller.

4. The method of claim 1, wherein the wheels are disposed above the transport rollers in an alternating arrangement.

5. The method of claim 1, wherein the wheels are configured to supply an adjustable force to the web.

6. The method of claim 1, wherein the wheels are configured to supply a force having both downward and outward components to the web.

7. The method of claim 1, wherein lifting the transverse edge portions includes contacting each edge portion with a lifting structure shaped to conform to the lifted edge portion.

8. The method of claim 7, wherein each lifting structure includes a concave lifting portion.

9. The method of claim 7, wherein each lifting structure includes a substantially planar lifting portion angled away from the central portion of the web.

10. The method of claim 1, wherein lifting the transverse edge portions is adjustable within a range of lift amounts.

* * * * *